(12) United States Patent
Chiu et al.

(10) Patent No.: US 8,431,946 B2
(45) Date of Patent: Apr. 30, 2013

(54) CHIP PACKAGE AND METHOD FOR FORMING THE SAME

(76) Inventors: Hsin-Chih Chiu, Banqiao (TW);
Chia-Ming Cheng, Taipei (TW);
Chuan-Jin Shiu, Zhongli (TW);
Bai-Yao Lou, Hsinchu (TW)

( * ) Notice: Subject to any disclaimer, the term of this patent is extended or adjusted under 35 U.S.C. 154(b) by 93 days.

(21) Appl. No.: 13/114,750

(22) Filed: May 24, 2011

(65) Prior Publication Data

US 2011/0291139 A1 Dec. 1, 2011

Related U.S. Application Data

(60) Provisional application No. 61/348,412, filed on May 26, 2010.

(51) Int. Cl.
*H01L 33/00* (2010.01)

(52) U.S. Cl.
USPC ............... 257/98; 257/797; 438/401; 438/22

(58) Field of Classification Search .................... 257/98, 257/797; 438/22, 401
See application file for complete search history.

(56) References Cited

U.S. PATENT DOCUMENTS

| | | | |
|---|---|---|---|
| 6,380,049 B1* | 4/2002 | Hamada et al. | 438/462 |
| 7,727,853 B2* | 6/2010 | Takeishi et al. | 438/401 |
| 2008/0042175 A1* | 2/2008 | Abe et al. | 257/292 |

* cited by examiner

*Primary Examiner* — Douglas Menz
(74) *Attorney, Agent, or Firm* — Liu & Liu (57) ABSTRACT

An embodiment of the invention provides a chip package which includes: a substrate having a first surface and a second surface; an optical device disposed on the first surface; a conducting pad disposed on the first surface; a first alignment mark formed on the first surface; and a light shielding layer disposed on the second surface and having a second alignment mark, wherein the second alignment mark corresponds to the first alignment mark.

20 Claims, 12 Drawing Sheets

CHIP PACKAGE AND METHOD FOR FORMING THE SAME

CROSS REFERENCE TO RELATED APPLICATIONS

This Application claims the benefit of U.S. Provisional Application No. 61/348,412, filed on May 26, 2010, the entirety of which is incorporated by reference herein.

BACKGROUND OF THE INVENTION

1. Field of the Invention

The present invention relates to a chip package, and in particular relates to a light sensing chip package or a light emitting chip package.

2. Description of the Related Art

Optical-electronic devices such as light sensing devices or light emitting devices play an important role in image capture or lamination applications. These optical-electronic devices are widely used in electronic devices such as digital cameras, digital video recorders, mobile phones, solar cells, screens, lamination elements, and so on.

Along with advancements in technological development, requirements for light emitting precision of light emitting devices or light sensing precision of light sensing devices have been increased.

BRIEF SUMMARY OF THE INVENTION

An embodiment of the invention provides a chip package which includes: a substrate having a first surface and a second surface; an optical device disposed on the first surface; a conducting pad disposed on the first surface; a first alignment mark formed on the first surface; and a light shielding layer disposed on the second surface and having a second alignment mark, wherein the second alignment mark corresponds to the first alignment mark.

An embodiment of the invention provides a method for forming a chip package, which includes: providing a substrate having a first surface and a second surface, wherein the substrate includes: an optical device disposed on the first surface; and a conducting pad disposed on the first surface; forming a first alignment mark on the first surface of the substrate; forming a second alignment mark corresponding to the first alignment mark on the second surface of the substrate; and forming a light shielding layer overlying the second surface of the substrate, wherein the light shielding layer is substantially and conformably formed on the second alignment mark such that the light shielding layer has a third alignment mark corresponding to the second alignment mark.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
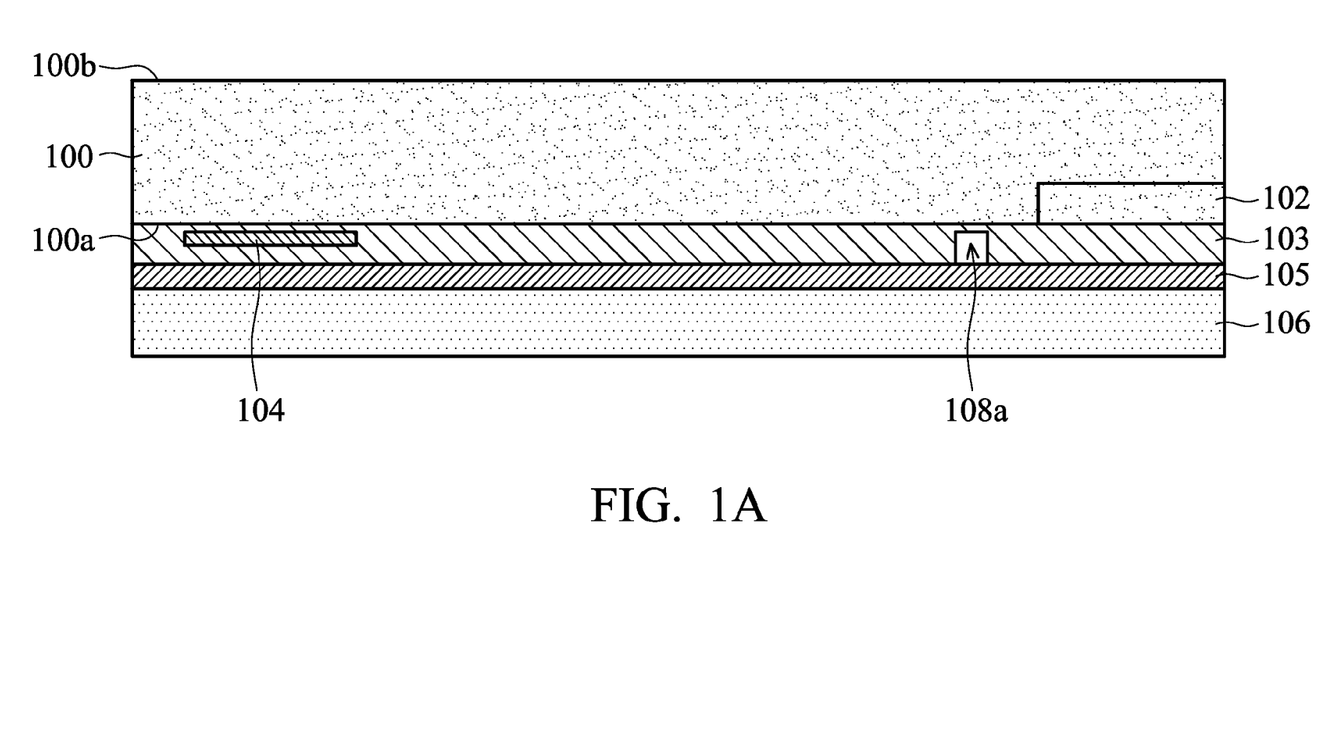
FIGS. 1A-1E are cross-sectional views showing the steps of forming a chip package in accordance with an embodiment of the present invention.

FIGS. 1A-1E are cross-sectional views showing the steps of forming a chip package according to an embodiment of the present invention. As shown in FIG. 1A, a substrate 100 is provided, which has a first surface 100a and a second surface 100b. The substrate 100 may be, for example, a semiconductor substrate or a ceramic substrate. In one embodiment, the substrate 100 is a semiconductor wafer such as a silicon wafer and a wafer-level packaging process may be performed to reduce fabrication cost and fabrication time.

As shown in FIG. 1A, in one embodiment, at least an optical device 102 is disposed on the surface 100a. The optical device 102 may include, but is not limited to, a light sensing device or a light emitting device. The light sensing device is, for example, a CMOS image sensor device while the light emitting device is, for example, a light emitting diode device.

In one embodiment, a conducting pad 104 is disposed on the surface 100a of the substrate 100. The conducting pad 104 may be electrically connected to, for example, the optical device 102 or another device in the package. In the embodiment shown in FIG. 1A, the conducting pad 104 is formed in the passivation layer 103 on the surface 100a. The passivation layer 103 may be, for example, a dielectric layer such as an oxide, nitride, oxynitride, or combinations thereof. In addition, although only a single layered conducting pad 104 is shown in FIG. 1A, a plurality of conducting pads may be stacked with each other and/or be arranged on the substrate 100. For example, in one embodiment, the conducting pad 104 may include a plurality of conducting pads stacked with each other, at least a conducting pad, or a conducting pad structure composed of at least a conducting pad and at least an interconnection structure.

As shown in FIG. 1A, in one embodiment, a transparent substrate 106 may be optionally disposed overlying the surface 100a of the substrate 100 and the optical device 102. The transparent substrate 106 may serve as a passivation layer for the optical device 102, which allows light from external environment to be transmitted to the optical device 102 or allows light emitted by the optical device 102 to be transmitted to the external environment through the transparent substrate 106. The transparent substrate 106 may be fixed on the substrate 100 through, for example, an adhesion layer 105. The transparent substrate 106 is, for example, a glass substrate, quartz substrate, transparent polymer substrate, or combinations thereof.

In one embodiment, an alignment mark is formed on the surface 100a of the substrate 100 to serve as an alignment target for following patterning processes. The alignment mark may be directly formed on the surface 100a of the substrate 100, which may be, for example, a sunken recess pattern or a protruding bump pattern. Alternatively, the alignment mark may be formed in another material layer on the surface 100a of the substrate 100. Taking the embodiment in FIG. 1A as an example, an alignment mark 108a is formed in the passivation layer 103 on the surface 100a of the substrate 100. As shown in FIG. 1A, the alignment mark 108a is a recess on a lower surface of the passivation layer 103. It should be appreciated that the alignment mark 108a is not limited to be a recess and may be a plurality of recess, bump, and/or combinations thereof without any shape limitation. For example, in another embodiment, the alignment mark 108a includes a bump (not shown) formed on the passivation layer 103.

Figure 1B:
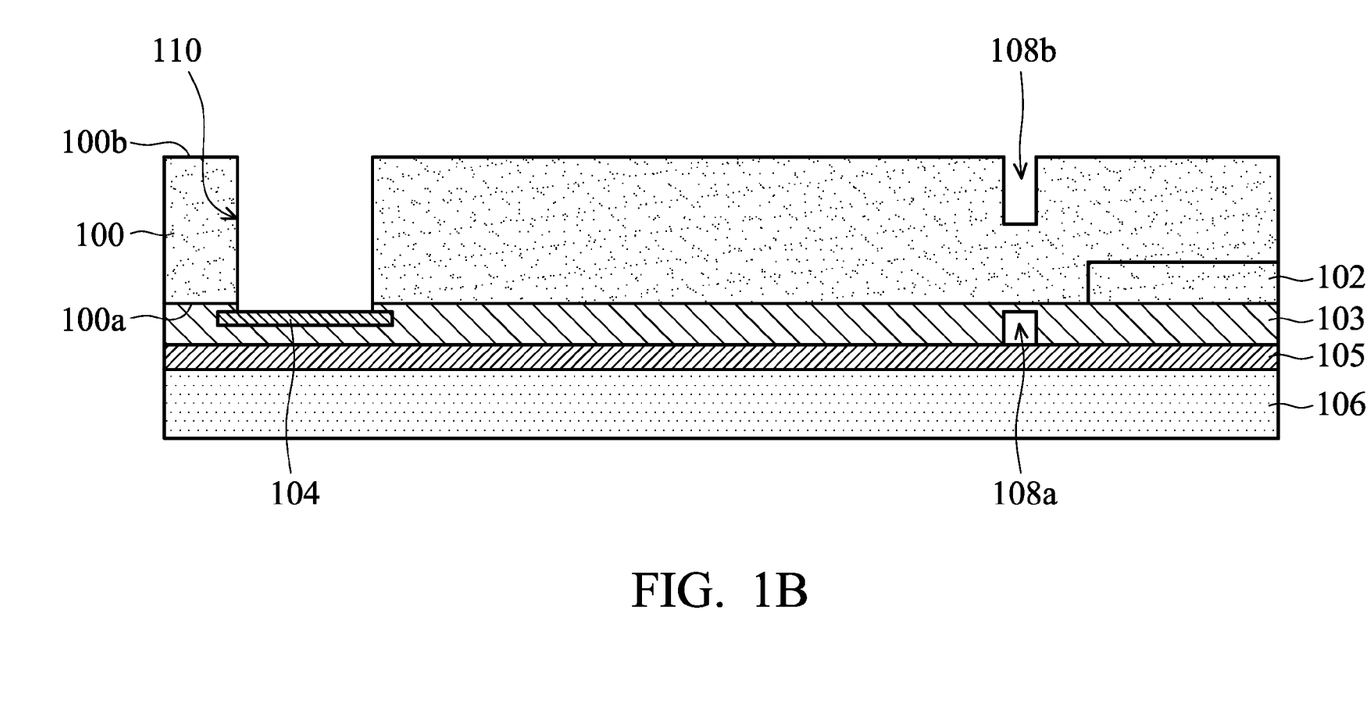

Next, as shown in FIG. 1B, an alignment mark 108b is formed on the surface 100b of the substrate corresponding to the alignment mark 108a. In other words, locations and dispositions of the alignment mark 108b are determined by the alignment mark 108a. For example, the alignment mark 108b may be defined according to the design rule. In one embodiment, the location of the alignment mark 108b substantially aligns with the alignment mark 108a. In another embodiment, the location of the alignment mark 108b does not align with the alignment mark 108a but is separated by a predetermined distance or has a predetermined relationship from each other. Because the alignment mark 108b corresponds to the alignment mark 108a, processes to be performed on two sides of the substrate 100 may be matched.

As shown in FIG. 1B, in one embodiment, a through-hole 110 may be optionally formed in the substrate 100. For example, a portion of the substrate 100 may be removed from the surface 100b of the substrate 100 to form the through-hole 110 extending towards the surface 100a. In one embodiment, the through-hole 110 and the alignment mark 108b are formed simultaneously. For example, the through-hole 110 and the alignment mark 108b may be formed in a same etching process. Note that in the embodiment in FIG. 1B, although a depth of the alignment mark 108b is less than a depth of the through-hole 110, embodiments of the invention are not limited thereto. In another embodiment, the depth of the alignment mark 108b may be substantially equal to or larger than the depth of the through-hole 110. In addition, in another embodiment, the through-hole 110 and the alignment mark 108b are formed in different processes, respectively.

In one embodiment, the through-hole 110 may expose a portion of the conducting pad 104. Further, a sidewall of the through-hole 110 may be a vertical sidewall or an inclined sidewall. In one embodiment, a size of an opening of the through-hole 110 is decreasing from the upper portion to the lower portion. In another embodiment, the size of the opening of the through-hole 110 is increasing from the upper portion to the lower portion. That is, in this case, the through-hole 110 has an "inverted angle" structure. In addition, in another embodiment, before the alignment mark 108b and the through-hole 110 are formed, a thinning process may be optionally performed to the substrate 100 to facilitate proceedings of following processes. For example, the transparent substrate 106 may be used as a support, and a thinning process such as a mechanical grinding or a chemical mechanical polishing is performed from the surface 100b of the substrate 100 to reduce the substrate 100 to a predetermined thickness.

Figure 1C:
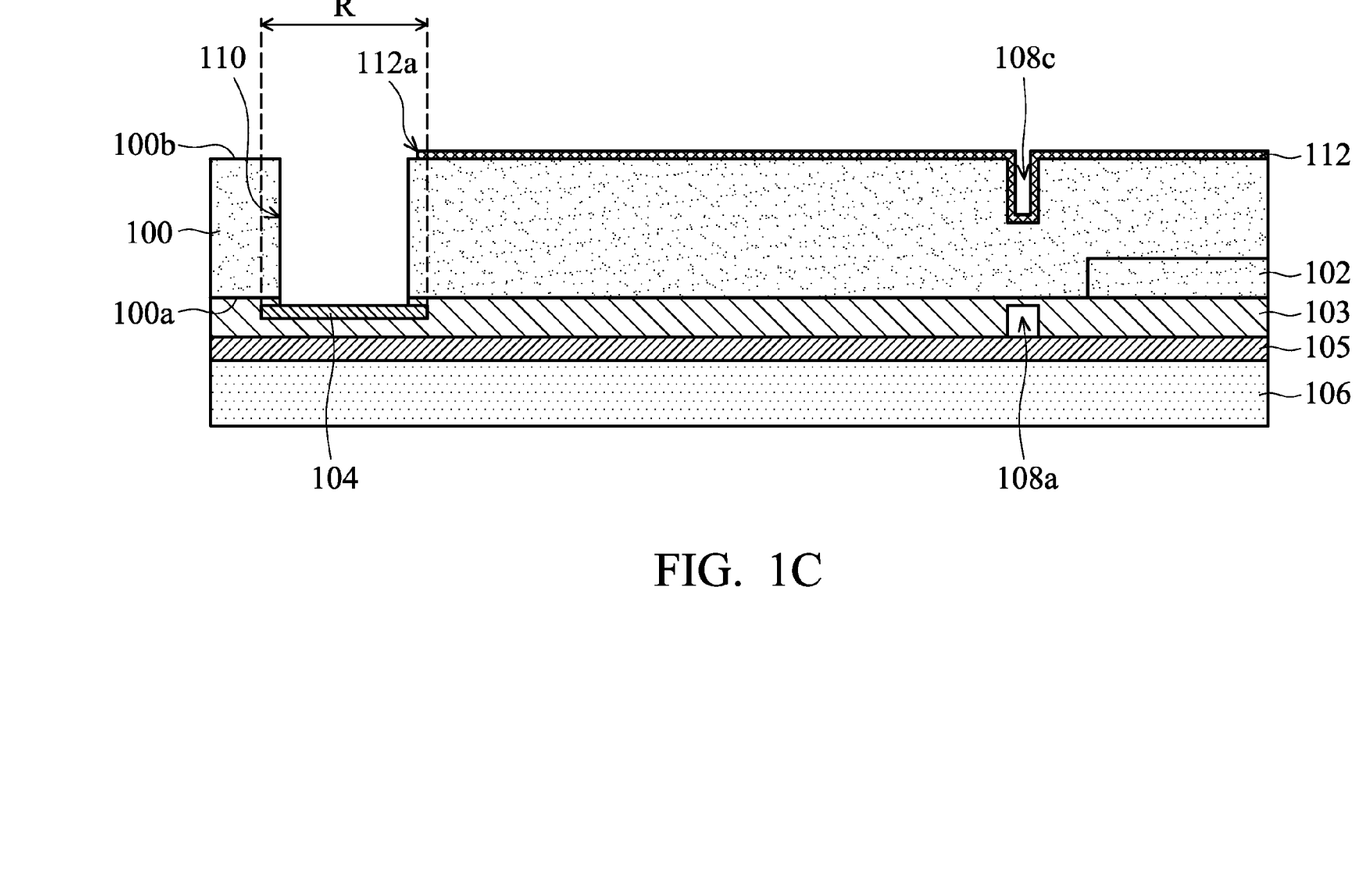

Next, as shown in FIG. 1C, a light shielding layer 112 is formed overlying the surface 100b of the substrate 100. A material of the light shielding layer 112 may include a polymer material, metal material, or combinations thereof. For example, the light shielding layer may be a black photoresist layer which is capable of being patterned through an exposure process and a development process. The light shielding layer 112 may help to block and/or absorb light coming from the outside of the chip package; especially from light behind the surface 100b of the substrate 100. Thus, operation of the optical device 102 may be improved. For example, when the optical device 102 is an image sensor device, the light shielding layer 112 may block light coming from the surface 100b of the substrate 100 to prevent noise of the image signals. Alternatively, when the optical device 102 is a light emitting device, the light shielding layer 112 may block the light coming from the surface 100b of the substrate 100 to prevent the wavelength and/or the intensity of the light emitted by the chip package from being affected by the light outside of the chip package.

As shown in FIG. 1C, the light shielding layer 112 may be substantially and conformably formed on the alignment mark 108b. Referring to FIGS. 1B and 1C, when the alignment mark 108b is a recess (see FIG. 1B), the light shielding layer 112 conformably formed thereon will also have a recess with a smaller size (see FIG. 1C), wherein the recess may also serve as an alignment target. Thus, in this embodiment, the light shielding layer 112 has an alignment mark 108c, as shown in FIG. 1C. As mentioned above, because the light shielding layer 112 may block and/or absorb light coming from the outside of the chip package, it is possible that the alignment mark 108a on the surface 100a of the substrate can not be detected after the light shielding layer 112 is formed. Thus, in this situation, the alignment mark 108c formed in the light shielding layer 112 may serve as the alignment mark to facilitate proceedings of following processes on the surface 100b of the substrate 100. Further, as mentioned above, the alignment marks 108a and 108b correspond to each other. Therefore, the alignment mark 108c formed corresponding to the alignment mark 108b will also correspond to the alignment mark 108a.

Still referring to FIG. 1C, in this embodiment, because the light shielding layer 112 is formed after the through-hole 110 is formed, the formed light shielding layer 112 may fill into a bottom portion and/or the sidewall of the through-hole 110. Thus, a patterning process is needed to be performed to the light shielding layer 112 such that there is substantially no shielding layer 112 in the through-hole to facilitate proceedings of following processes. In one embodiment, when the light shielding layer 112 is patterned, the process condition may be controlled such that a side 112a of the light shielding layer 112 is separated from the through-hole 110 by a distance to ensure the light shielding layer 112 is substantially and completely removed from the through-hole 110.

For example, in one embodiment, the light shielding layer 112 may be a black photoresist layer which is usually (but is not limited to) a negative resist. In this case, the alignment mark 108c in the light shielding layer 112 may be used as an alignment target, and an exposure process and a development processes are performed to the light shielding layer 112 in the through-hole 110 and a portion of the light shielding layer 112 surrounding the through-hole 110. However, it should be appreciated that in another embodiment, the light shielding layer 112 may be a polymer material of another type, metal material, or combinations thereof.

Figure 3A:
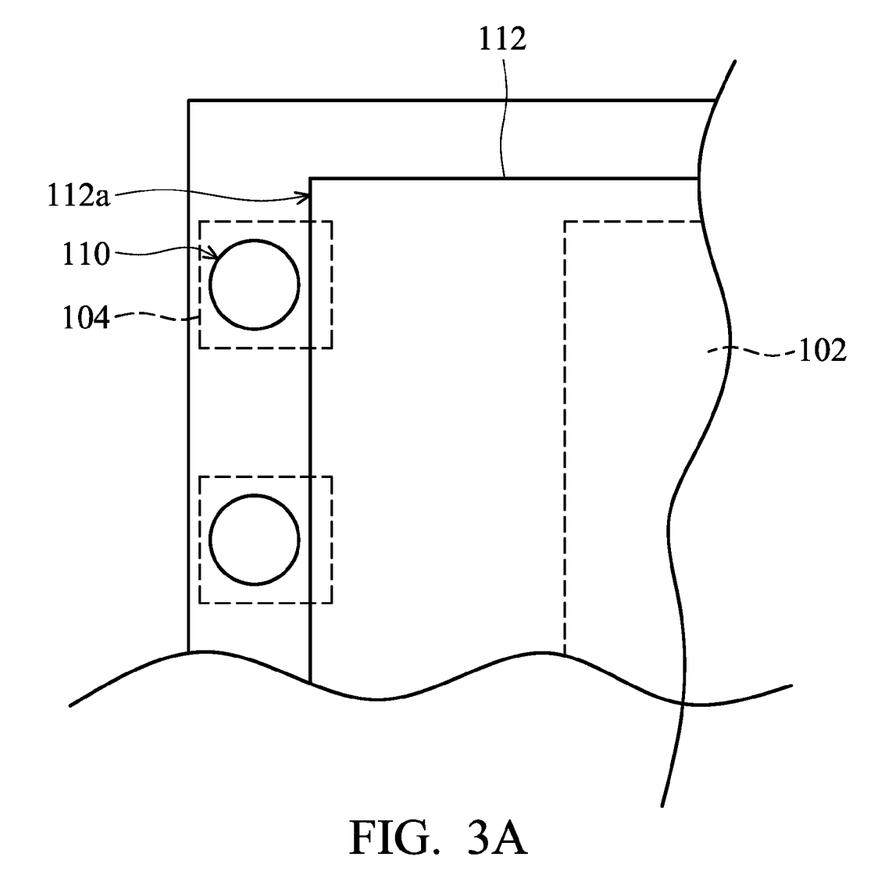
FIGS. 3A-3B are illustrative perspective top views respectively showing a chip package in accordance with embodiments of the present invention.

In one embodiment, the side 112a of the light shielding layer 112 is located between the optical device 102 and the through-hole 110, as shown in FIG. 1C. In the embodiment in FIG. 1C, the side 112a of the light shielding layer 112 is further located within an area R of a direct projection of the conducting pad 104 on the surface 100b. FIG. 3A shows an illustrative perspective top view in this situation, which shows locations of some elements, for helping with the understanding of position relationships between elements. As shown in FIG. 3A, the light shielding layer 112 partially overlaps the conducting pad 104 in a vertical direction, and the side 112a of the light shielding layer 112 is located between the optical device 102 and the through-hole 110.

Figure 3B:
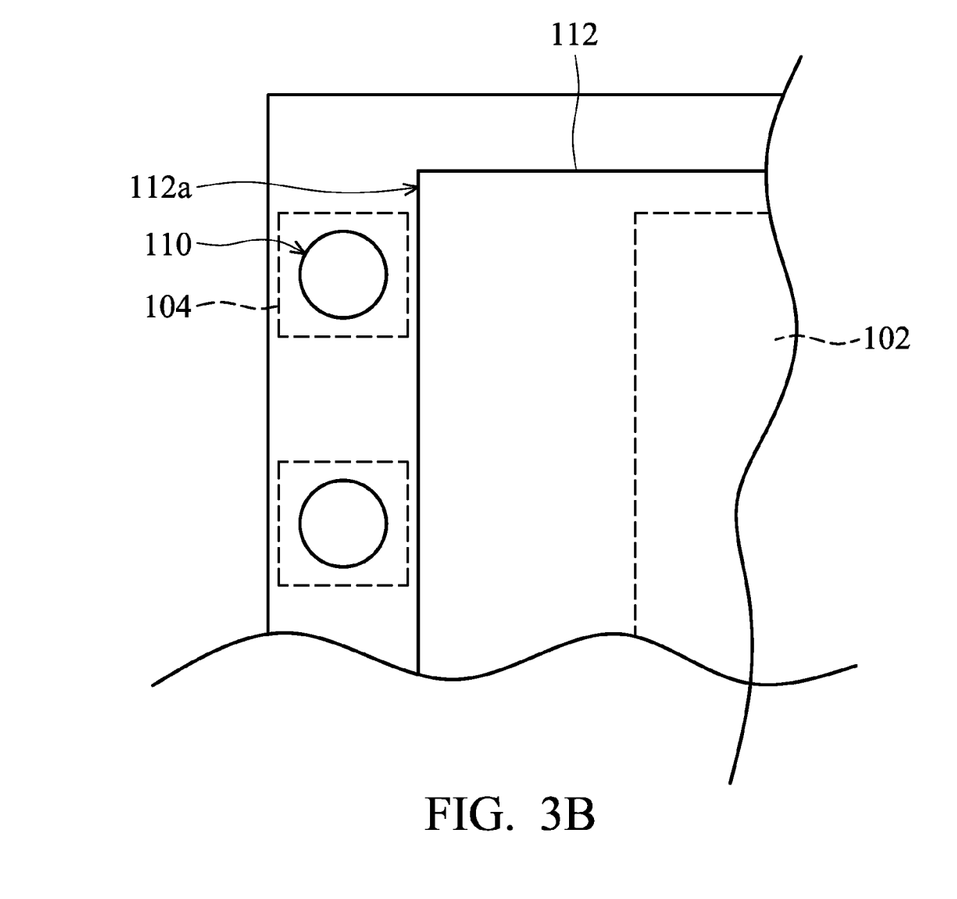

In another embodiment, the side 112a of the light shielding layer 112 may be located outside of the area R of the direct projection of the conducting pad 104 on the surface 100b, depending on requirements. FIG. 3B shows an illustrative perspective top view in this situation, which shows locations of some elements, for helping with the understanding of position relationships between elements. As shown in FIG. 3B, the light shielding layer 112 substantially does not overlap with the conducting pad 104 in the vertical direction, and the side 112a of the light shielding layer 112 is located between the optical device 102 and the through-hole 110.

In one embodiment, because the side 112a of the light shielding layer 112 is located within the area R of the direct projection of the conducting pad 104 on the surface 100b (that is, the light shielding layer 112 overlaps the conducting pad 104 in the vertical direction), it is ensured that light coming from the external environment may be substantially blocked and/or absorbed by the light shielding layer 112 and the conducting pad 104.

Figure 1D:
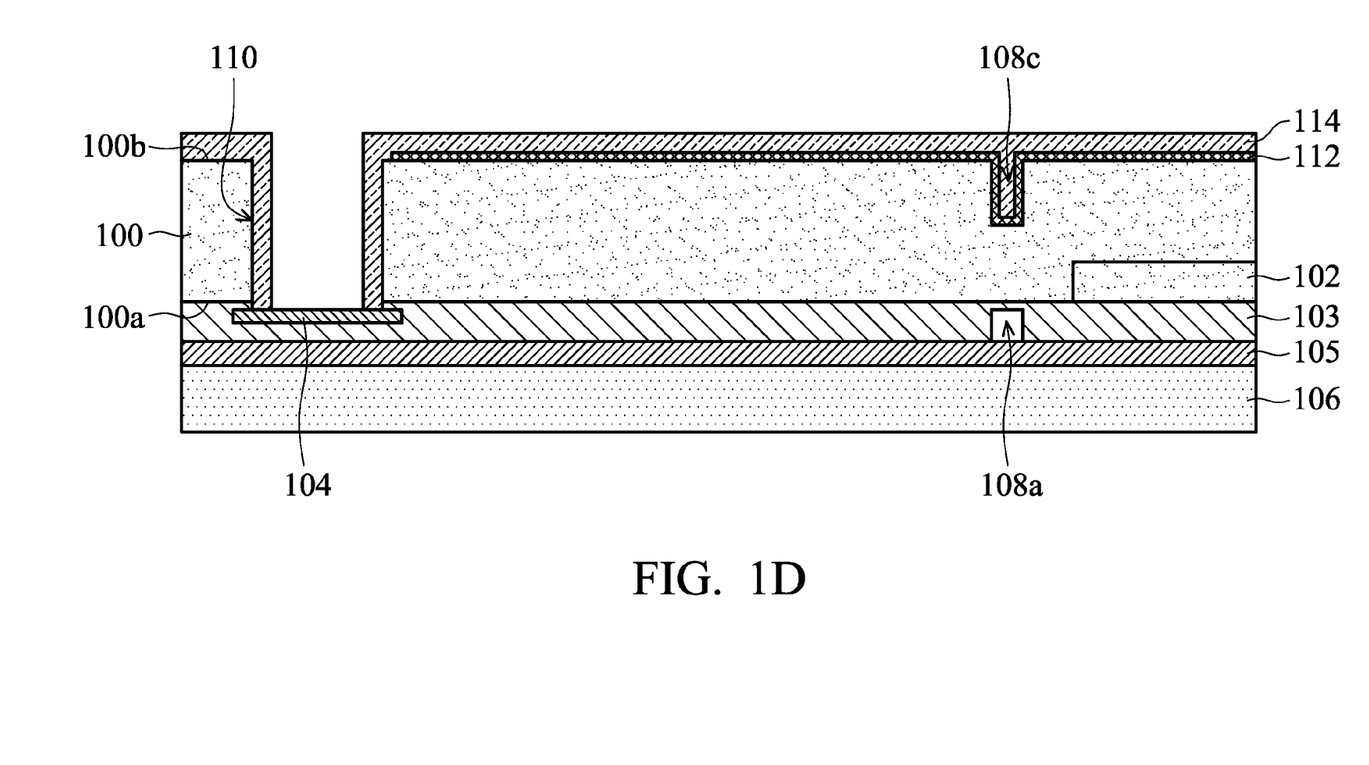

Next, as shown in FIG. 1D, in one embodiment, after the light shielding layer 112 is formed, an insulating layer 114 is formed on the sidewall of the through-hole 110 and the surface 100b of the substrate 100. In this case, the light shielding layer 112 is located between the substrate 100 and the insulating layer 114. In one embodiment, the insulating layer 114 is formed overlying the bottom portion of the through-hole 110 such that the conducting pad 104 is covered. In this case, a patterning process may be performed to the insulating layer 114 to remove a portion of the insulating layer 114 on the bottom portion of the through-hole 110 such that the conducting pad 104 is exposed.

Figure 1E:
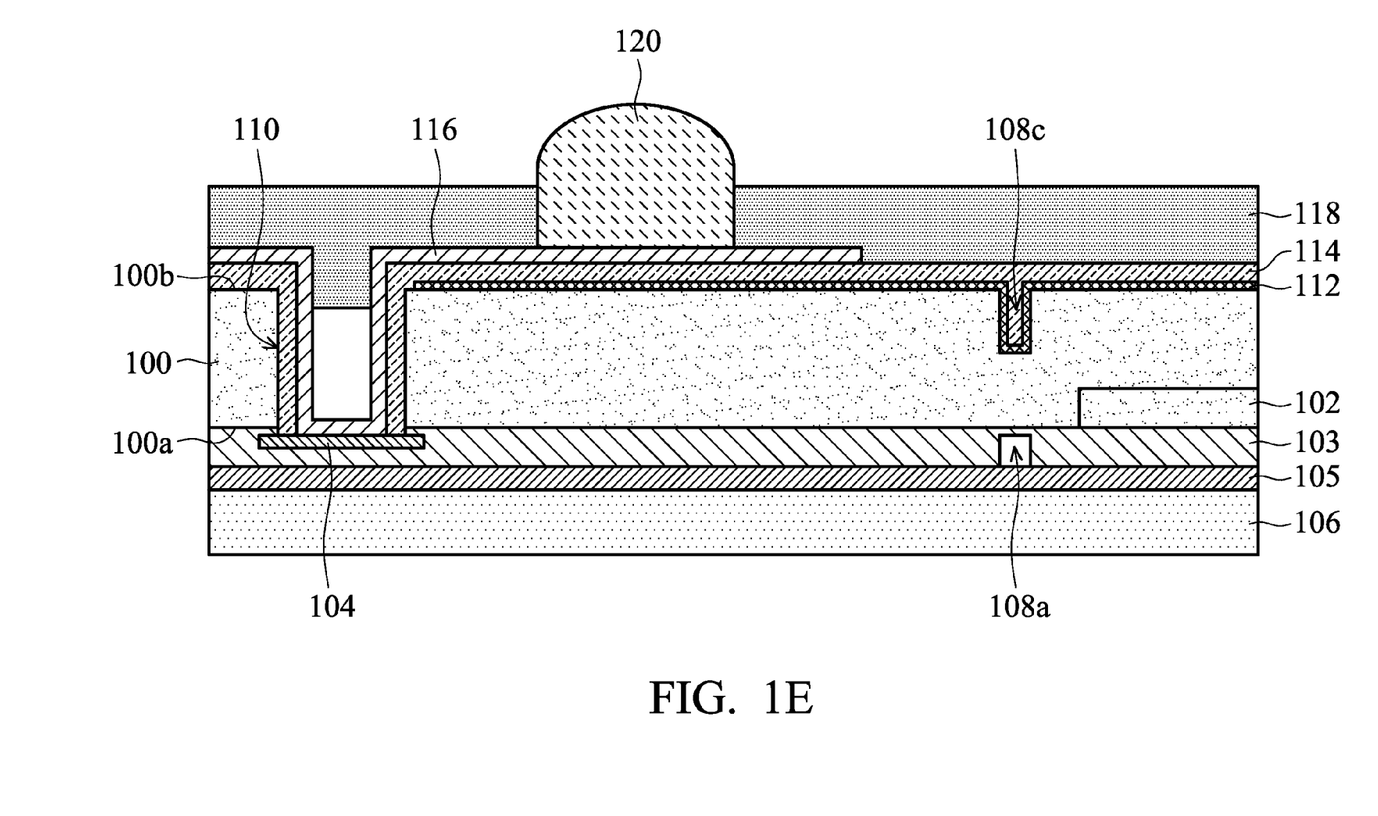

As shown in FIG. 1E, a conducting layer 116 is then formed overlying the insulating layer 114 in the through-hole 110 and the surface 100b. In one embodiment, the conducting layer 116 is electrically connected to the conducting pad 104. The conducting layer 116 may electrically contact the conducting pad 104 at the bottom portion of the through-hole 110 and extend upwardly along the sidewall of the through-hole 110 and overlying the surface 100b.

As shown in FIG. 1E, in one embodiment, a passivation layer 118 may be optionally formed overlying the surface 100b, which may be, for example, a solder mask layer, green paint, or the like. Then, a conducting bump 120 may be formed on the surface 100b, wherein the passivation layer 118 partially surrounds the conducting bump 120, and the conducting bump 120 is electrically connected to the conducting pad 104. For example, after the passivation layer 118 is formed, a portion of the passivation layer 118 may be removed to form openings exposing a portion of the conducting layer 116. Then, the conducting bump 120 is formed in the openings exposing the conducting layer 116. The conducting bump 120 may be electrically connected to the conducting pad 104 through the conducting layer 116.

Figure 2A:
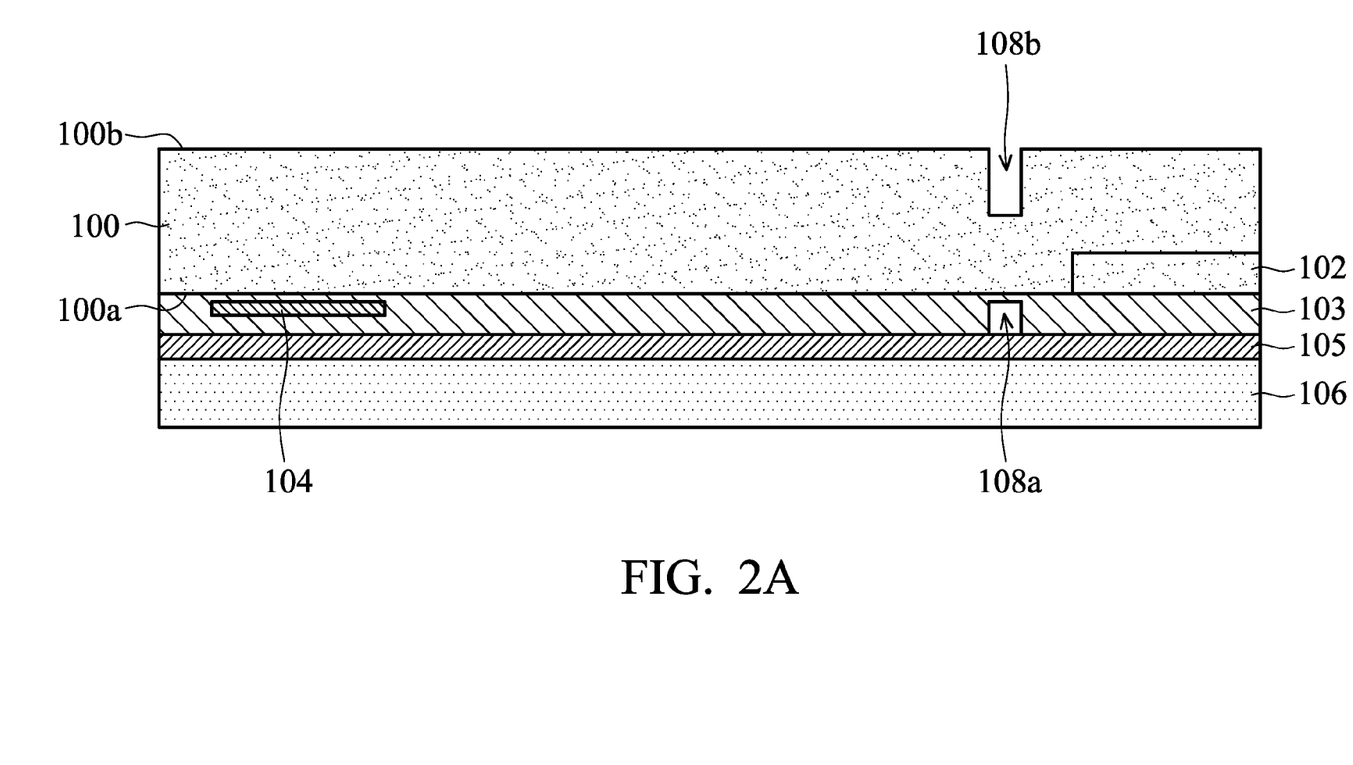
FIGS. 2A-2E are cross-sectional views showing the steps of forming a chip package in accordance with an embodiment of the present invention.

FIGS. 2A-2E are cross-sectional views showing the steps of forming a chip package according to an embodiment of the present invention, wherein same or similar reference numbers are used to designate same or similar elements. As shown in FIG. 2A, a substrate 100 is provided, which has a first surface 100a and a second surface 100b. At least an optical device 102 is disposed on the surface 100a. The optical device 102 may include, but is not limited to, a light sensing device or a light emitting device. The light sensing device is, for example, a CMOS image sensor device while the light emitting device is, for example, a light emitting diode device. In one embodiment, a conducting pad 104 is disposed on the surface 100a of the substrate 100. The conducting pad 104 may be electrically connected to, for example, the optical device 102 or another device in the package.

As shown in FIG. 2A, in one embodiment, a transparent substrate 106 may be optionally disposed overlying the surface 100a of the substrate 100 and the optical device 102. The transparent substrate 106 may be fixed on the substrate 100 through, for example, an adhesion layer 105.

In one embodiment, an alignment mark is formed on the surface 100a of the substrate 100 to serve as an alignment target for following patterning processes. The alignment mark may be directly formed on the surface 100a of the substrate 100, which may be, for example, a sunken recess pattern or a protruding bump pattern. Alternatively, the alignment mark may be formed in another material layer on the surface 100a of the substrate 100. Taking the embodiment in FIG. 2A as an example, an alignment mark 108a is formed in the passivation layer 103 on the surface 100a of the substrate 100. As shown in FIG. 2A, the alignment mark 108a is a recess on a lower surface of the passivation layer 103. It should be appreciated that the alignment mark 108a is not limited to be a recess and may be a plurality of recess, bump, and/or combinations thereof without any shape limitation.

Figure 2B:
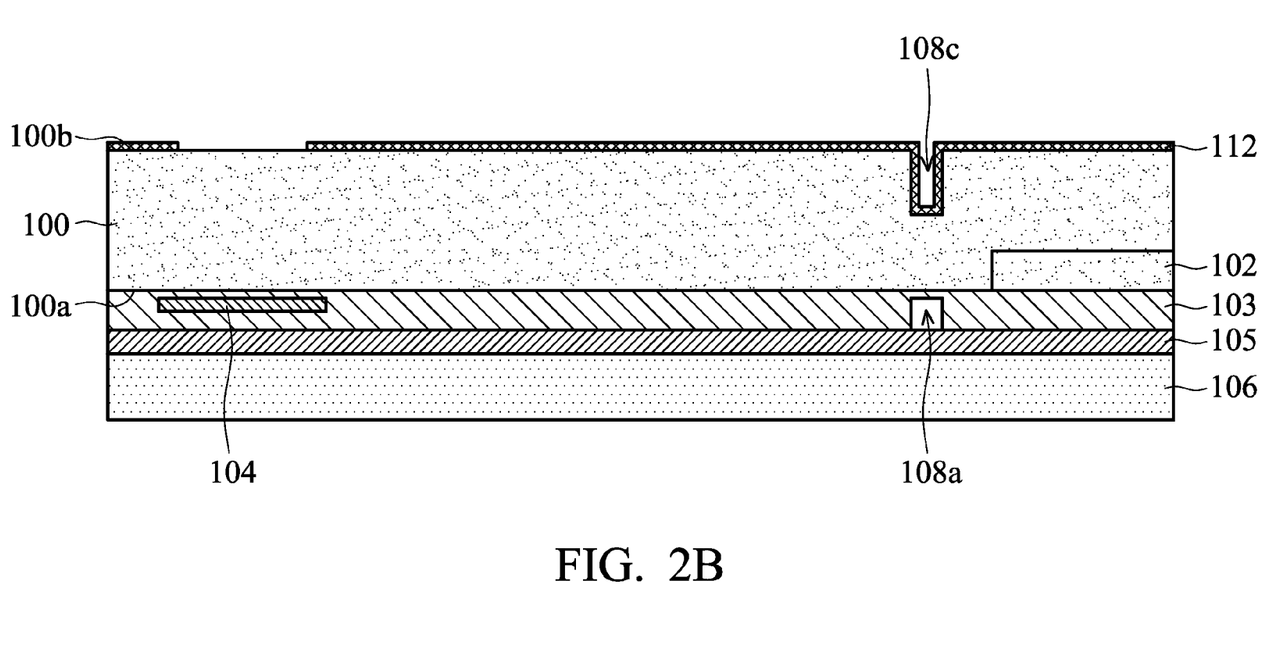

Next, as shown in FIG. 2B, an alignment mark 108b is formed on the surface 100b of the substrate corresponding to the alignment mark 108a. In another words, locations and dispositions of the alignment mark 108b are determined by the alignment mark 108a. In one embodiment, the location of the alignment mark 108b substantially aligns with the alignment mark 108a. In another embodiment, the location of the alignment mark 108b does not align with the alignment mark 108a but is separated by a predetermined distance or has a predetermined relationship from each other. Because the alignment mark 108b corresponds to the alignment mark 108a, processes to be performed on two sides of the substrate 100 may be matched.

Next, as shown in FIG. 2B, a light shielding layer 112 is formed overlying the surface 100b of the substrate 100. A material of the light shielding layer 112 may include a polymer material, metal material, or combinations thereof. For example, the light shielding layer may be a black photoresist layer which is capable of being patterned through an exposure process and a development process.

As shown in FIG. 2B, the light shielding layer 112 may be substantially and conformably formed on the alignment mark 108b. Referring to FIGS. 2A and 2B, when the alignment mark 108b is a recess (see FIG. 2A), the light shielding layer 112 conformably formed thereon will also have a recess with a smaller size (see FIG. 2B), wherein the recess may also serve as an alignment target. Thus, in this embodiment, the light shielding layer 112 has an alignment mark 108c, as shown in FIG. 2B.

Because the light shielding layer 112 may block and/or absorb light coming from the outside of the chip package, it is possible that the alignment mark 108a on the surface 100a of the substrate can not be detected after the light shielding layer 112 is formed. Thus, the alignment mark 108c formed in the light shielding layer 112 may serve as the alignment mark to facilitate proceedings of following processes on the surface 100b of the substrate 100. Further, as mentioned above, the alignment mark 108a and 108b correspond to each other. Therefore, the alignment mark 108c formed corresponding to the alignment mark 108b will also correspond to the alignment mark 108a.

In one embodiment, a through-hole may be optionally formed in the substrate 100. In this case, the light shielding layer 112 formed previously is patterned to form openings exposing a portion of the substrate 100, as shown in FIG. 2B. In one embodiment, the alignment mark 108c in the light shielding layer 112 may be used as an alignment target to pattern the light shielding layer 112. For example, when the light shielding layer 112 is a black photoresist layer, an exposure process may only be applied to the light shielding layer 112 at specific locations through the positioning of the alignment mark 108c. After a following development process, a patterned light shielding layer 112 may be formed. Alternatively, in another embodiment, a metal layer may be chosen to be the light shielding layer 112. In this case, a patterned photoresist layer may be formed on the metal layer. Then, an etching process is performed to pattern the metal layer to be the desired light shielding layer 112.

Figure 2C:
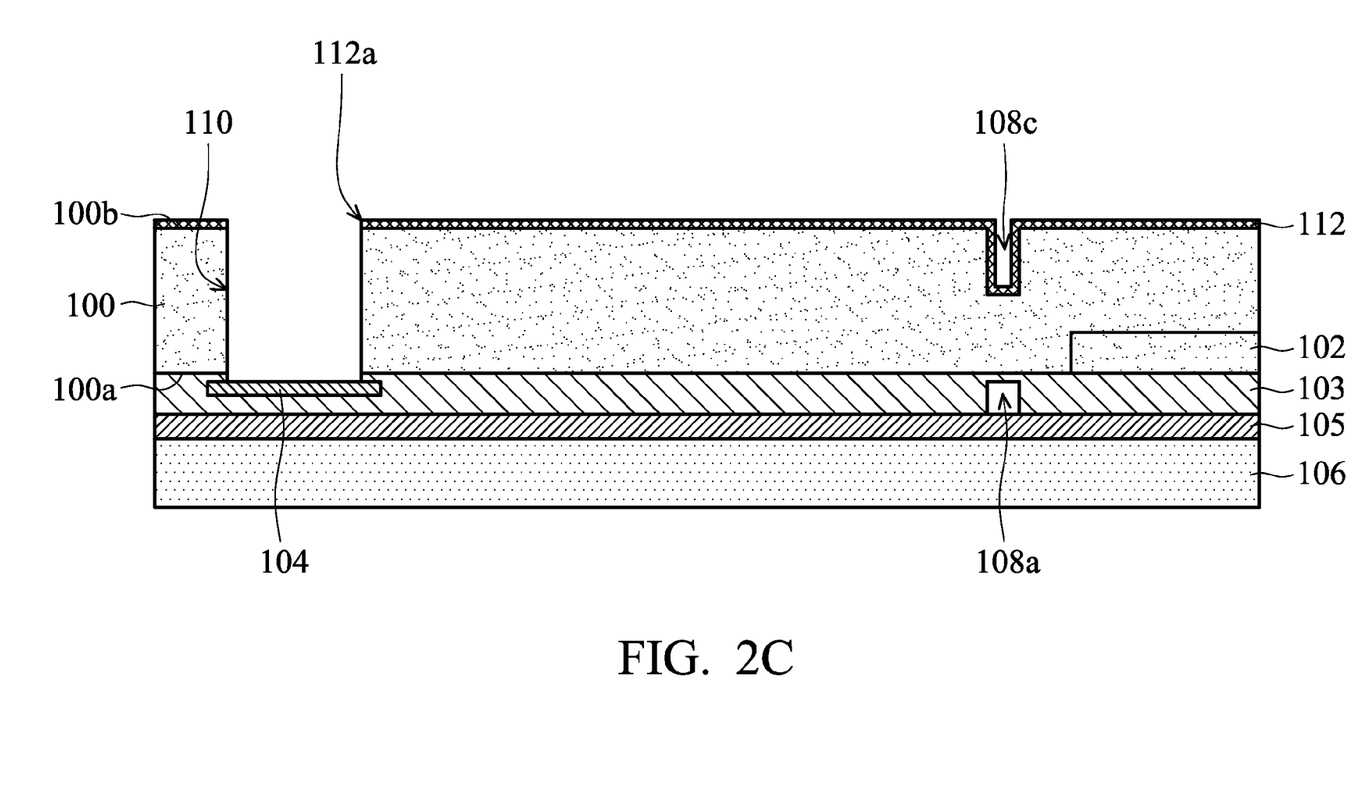

Next, as shown in FIG. 2C, a portion of the substrate 100 may be removed from the surface 100b of the substrate 100 by using the light shielding layer 112 as a mask to form a through-hole 110 extending towards the surface 100a. In the embodiment in FIG. 2C, although a depth of the alignment mark 108c is less than a depth of the through-hole 110, embodiments of the invention are not limited thereto. In another embodiment, the depth of the alignment mark 108c may be substantially equal to or larger than the depth of the through-hole 110. In one embodiment, the through-hole 110 is formed by an etching process. Thus, a metal layer having a relatively high etching selectivity ratio to the substrate 100 may be chosen to be the light shielding layer 112.

In one embodiment, the through-hole 110 may expose a portion of the conducting pad 104. Further, a sidewall of the through-hole 110 may be a vertical sidewall or an inclined sidewall. In one embodiment, a size of an opening of the through-hole 110 is decreasing from the upper portion to the lower portion. In another embodiment, the size of the opening of the through-hole 110 is increasing from the upper portion to the lower portion. That is, in this case, the through-hole 110 has an "inverted angle" structure. In addition, in another embodiment, before the alignment mark 108b and the through-hole 110 are formed, a thinning process may be optionally performed to the substrate 100 to facilitate proceedings of following processes. For example, the transparent substrate 106 may be used as a support, and a thinning process such as a mechanical grinding or a chemical mechanical polishing is performed from the surface 100b of the substrate 100 to reduce the substrate 100 to a predetermined thickness.

Still referring to FIG. 2C, in this embodiment, because the through-hole 110 is formed by using the light shielding layer 112 as a mask, a side 112a of the formed light shielding layer 112 is substantially coplanar with the sidewall of the through-hole 110, as shown in FIG. 2C.

Figure 2D:
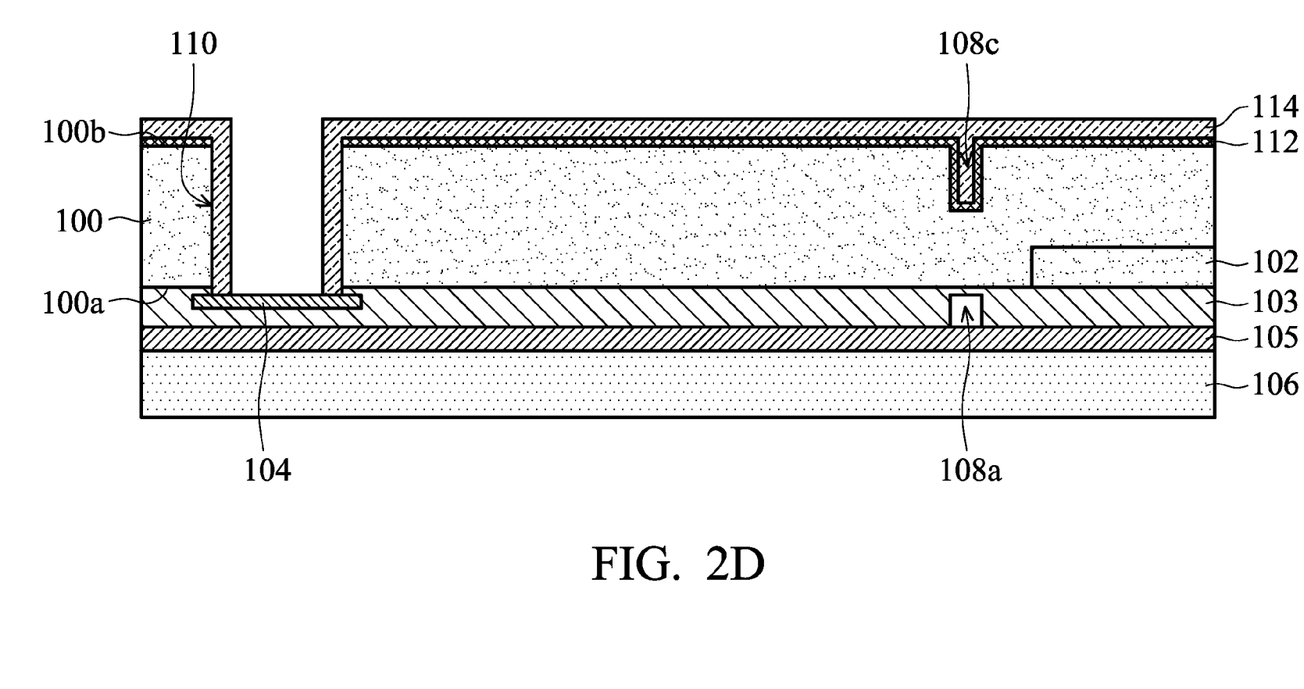

Next, as shown in FIG. 2D, in one embodiment, an insulating layer 114 is formed on the sidewall of the through-hole 110 and the surface 100b of the substrate 100. In one embodiment, the insulating layer 114 is formed overlying the bottom portion of the through-hole 110 such that the conducting pad 104 is covered. In this case, a patterning process may be performed to the insulating layer 114 to remove a portion of the insulating layer 114 on the bottom portion of the through-hole 110 such that the conducting pad 104 is exposed.

Figure 2E:
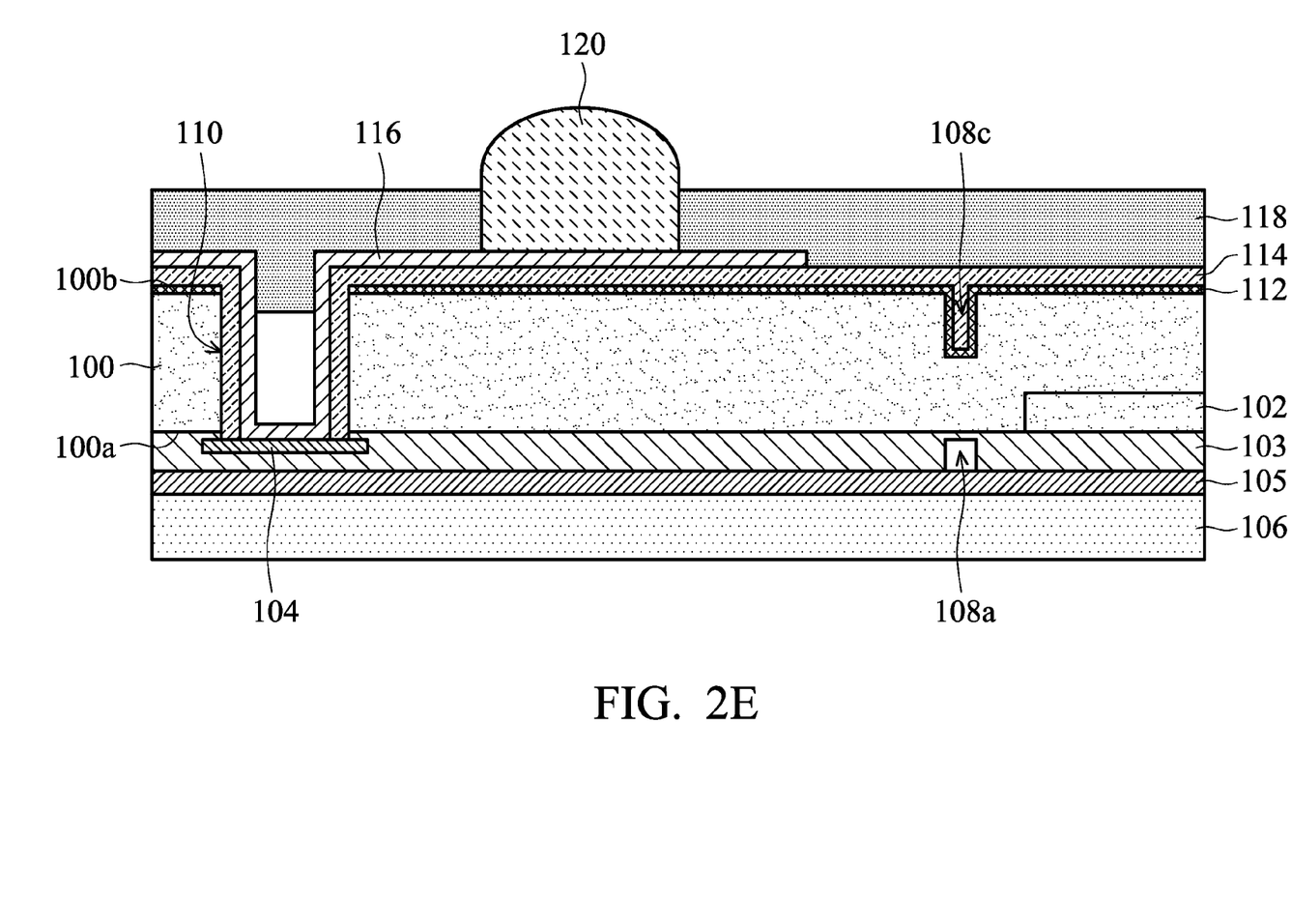

As shown in FIG. 2E, a conducting layer 116 is then formed overlying the insulating layer 114 in the through-hole 110 and the surface 100b. In one embodiment, the conducting layer 116 is electrically connected to the conducting pad 104. The conducting layer 116 may electrically contact the conducting pad 104 at the bottom portion of the through-hole 110 and extend upwardly along the sidewall of the through-hole 110 and overlying the surface 100b.

As shown in FIG. 2E, in one embodiment, a passivation layer 118 may be optionally formed overlying the surface 100b, which may be, for example, a solder mask layer, green paint, or the like. Then, a conducting bump 120 may be formed on the surface 100b, wherein the passivation layer 118 partially surrounds the conducting bump 120, and the conducting bump 120 is electrically connected to the conducting pad 104. For example, after the passivation layer 118 is formed, a portion of the passivation layer 118 may be removed to form openings exposing a portion of the conducting layer 116. Then, the conducting bump 120 is formed in the openings exposing the conducting layer 116. The conducting bump 120 may be electrically connected to the conducting pad 104 through the conducting layer 116.

In embodiments of the invention, light coming from the external environment may be blocked and/or absorbed by the light shielding layer such that operation of the chip package is more smoother. In embodiments of the invention, an alignment mark is formed in the light shielding layer such that following processes are more precise, thus improving product yield of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface;
   an optical device disposed on the first surface;
   a conducting pad disposed on the first surface;
   a first alignment mark formed on the first surface; and
   a light shielding layer disposed on the second surface and having a second alignment mark, wherein the second alignment mark corresponds to the first alignment mark.

2. The chip package as claimed in claim 1, further comprising:
   a through-hole extending from the second surface towards the first surface;
   an insulating layer formed overlying a sidewall of the through-hole and extending onto the second surface of the substrate; and
   a conducting layer formed overlying the insulating layer in the through-hole and extending overlying the insulating layer on the second surface, wherein the conducting layer is electrically connected to the conducting pad.

3. The chip package as claimed in claim 2, wherein the light shielding layer has a side, wherein the side is separated from the through-hole by a distance.

4. The chip package as claimed in claim 3, wherein the side of the light shielding layer is between the optical device and the through-hole.

5. The chip package as claimed in claim 4, wherein the side of the light shielding layer is located within an area of a direct projection of the conducting pad on the second surface.

6. The chip package as claimed in claim 2, wherein the light shielding layer is located between the substrate and the insulating layer.

7. The chip package as claimed in claim 2, wherein the light shielding layer has a side, wherein the side is substantially coplanar with the sidewall of the through-hole.

8. The chip package as claimed in claim 1, further comprising a transparent substrate disposed overlying the first surface of the substrate and the optical device.

9. The chip package as claimed in claim 1, wherein the first alignment mark is formed in a material layer on the first surface of the substrate.

10. The chip package as claimed in claim 1, further comprising:
    a passivation layer disposed overlying the second surface of the substrate; and
    a conducting bump disposed overlying the second surface, wherein the passivation layer partially surrounds the conducting bump, and the conducting bump is electrically connected to the conducting pad.

11. A method for forming a chip package, comprising:
    providing a substrate having a first surface and a second surface, wherein the substrate comprises:
    an optical device disposed on the first surface; and
    a conducting pad disposed on the first surface;
    forming a first alignment mark on the first surface of the substrate;
    forming a second alignment mark corresponding to the first alignment mark on the second surface of the substrate; and
    forming a light shielding layer overlying the second surface of the substrate, wherein the light shielding layer is substantially and conformably formed on the second alignment mark such that the light shielding layer has a third alignment mark corresponding to the second alignment mark.

12. The method for forming a chip package as claimed in claim 11, further comprising:
    removing a portion of the substrate from the second surface of the substrate to form a through-hole extending towards the first surface of the substrate;
    forming an insulating layer on a sidewall of the through-hole and the second surface of the substrate; and
    forming a conducting layer overlying the insulating layer in the through-hole and the insulating layer on the second surface, wherein the conducting layer is electrically connected to the conducting pad.

13. The method for forming a chip package as claimed in claim 12, wherein the through-hole and the second alignment mark are formed simultaneously.

14. The method for forming a chip package as claimed in claim 12, wherein the insulating layer is formed after the light shielding layer is formed.

15. The method for forming a chip package as claimed in claim 12, wherein the light shielding layer is formed after the through-hole is formed.

16. The method for forming a chip package as claimed in claim 15, further comprising patterning the light shielding layer by using the third alignment mark of the light shielding layer as an alignment target such that there is substantially no light shielding layer within the through-hole, and a side of the light shielding layer is separated from the through-hole by a distance.

17. The method for forming a chip package as claimed in claim 12, wherein the light shielding layer is formed before the through-hole is formed.

18. The method for forming a chip package as claimed in claim 17, further comprising:
    patterning the light shielding layer to form an opening by using the third alignment mark of the light shielding layer as an alignment target, wherein the opening exposes a portion of the substrate; and
    using the light shielding layer as a mask to remove a portion of the substrate from the exposed substrate to form the through-hole extending from the second surface towards the first surface.

19. The method for forming a chip package as claimed in claim 11, further comprising disposing a transparent substrate overlying the first surface of the substrate and the optical device.

20. The method for forming a chip package as claimed in claim 11, further comprising:
    forming a passivation layer overlying the second surface of the substrate; and
    forming a conducting bump overlying the second surface, wherein the passivation layer partially surrounds the conducting bump, and the conducting bump is electrically connected to the conducting pad.

* * * * *